United States Patent
Lu

(10) Patent No.: US 11,982,690 B2
(45) Date of Patent: May 14, 2024

(54) METHOD, SYSTEM, AND NON-TRANSITORY COMPUTER READABLE MEDIUM FOR DETECTING TIME DIFFERENCE

(71) Applicant: Fulian Precision Electronics (Tianjin) Co., LTD., Tianjin (CN)

(72) Inventor: Po-Hui Lu, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 162 days.

(21) Appl. No.: 17/887,608

(22) Filed: Aug. 15, 2022

(65) Prior Publication Data
US 2023/0305038 A1    Sep. 28, 2023

(30) Foreign Application Priority Data
Mar. 28, 2022   (CN) .......................... 202210312353.X

(51) Int. Cl.
    *G01R 13/32*    (2006.01)
(52) U.S. Cl.
    CPC .................... *G01R 13/32* (2013.01)
(58) Field of Classification Search
    CPC ..................................................... G01R 13/32
    See application file for complete search history.

(56) References Cited

U.S. PATENT DOCUMENTS 5,141,306 A * 8/1992 Gasoi ..................... G03B 31/02
                                                 352/244

FOREIGN PATENT DOCUMENTS

| CN | 102158728 A | 8/2011 |
| CN | 106851259 A | 6/2017 |

* cited by examiner

*Primary Examiner* — Alesa Allgood
(74) *Attorney, Agent, or Firm* — ScienBiziP, P.C.

(57) ABSTRACT

A method, a system, and a non-transitory computer readable medium for detecting time difference include a transmitting device and a receiving device being in time synchronization; an oscilloscope detecting a time difference generated thereof to obtain a first time difference; the transmitting device generating a first system time, based on the first system time, generating a first image, and transmitting the first image to a display to generate a second time difference; an image capturing device obtaining the first image from the display and generating a first signal, to generate a third time difference; the receiving device receiving the first signal to generate a fourth time difference, and obtaining the first system time according to the first signal and generating a second system time when obtaining the first system time, and to generate a fifth time difference.

17 Claims, 4 Drawing Sheets

METHOD, SYSTEM, AND NON-TRANSITORY COMPUTER READABLE MEDIUM FOR DETECTING TIME DIFFERENCE

CROSS-REFERENCE TO RELATED APPLICATIONS

This application claims priority to Chinese Patent Application No. 202210312353.X filed on Mar. 28, 2022, in China National Intellectual Property Administration, the contents of which are incorporated by reference herein.

FIELD

The subject matter herein generally relates to server technology, and particularly to a method, a system, and a non-transitory computer readable medium for detecting time difference.

BACKGROUND

Industrial applications for signal processing and transmitting such as image capturing devices are developing rapidly. However, time delays in signal processing and transmissions may affect or even prevent good security of the industrial application. Additionally, detecting a time difference generated by the image capturing device is becoming more and more important.

There are two methods for detecting time differences of an image capturing device: manually detecting on site and non-automatic traceability detecting. Detecting time differences of the operation of image capturing device by manually detecting on site has low efficiency, high human source cost, and is time-consuming. Detecting operation time differences of the image capturing device by non-automatic traceability detecting needs the digital time data being manually obtained and retroactively calculating time difference in different phases, which is low efficiency. Thus, rapid and precise detection of the operation time differences of the image capturing device needs to be improved in the art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
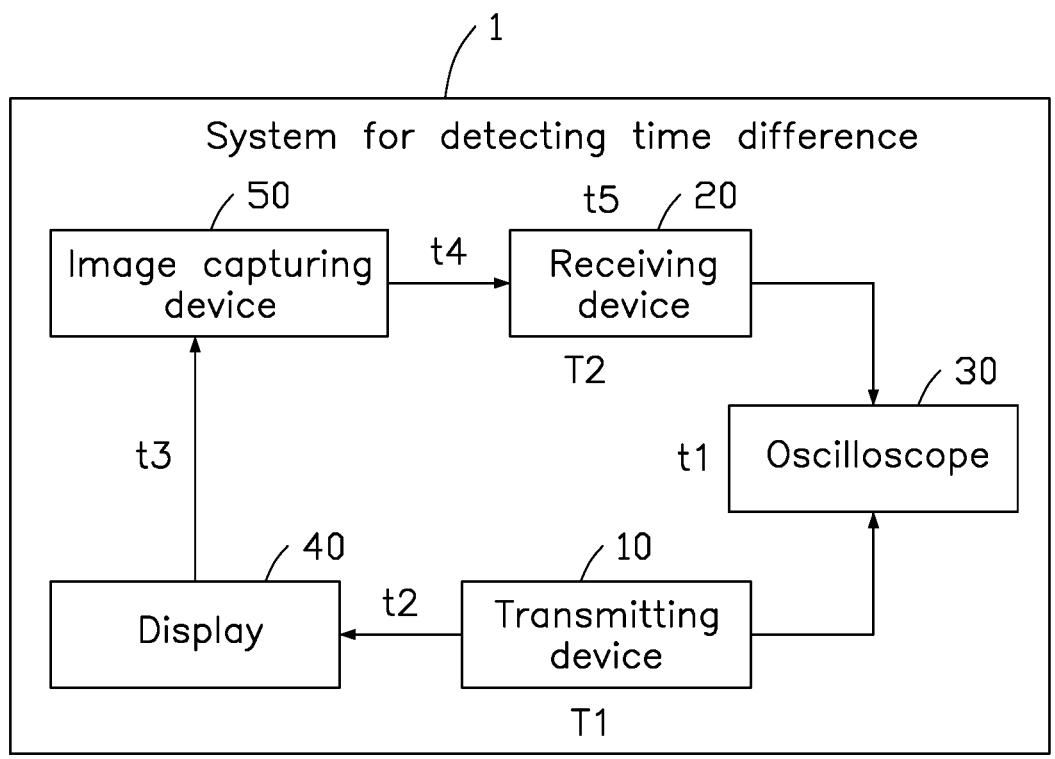
FIG. 1 is a schematic view of at least one embodiment of a system for detecting time difference.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one."

Furthermore, the term "module", as used herein, refers to logic embodied in hardware or firmware, or to a collection of software instructions, written in a programming language, such as Java, C, or assembly. One or more software instructions in the modules can be embedded in firmware, such as in an EPROM. The modules described herein can be implemented as either software and/or hardware modules and can be stored in any type of non-transitory computer-readable medium or another storage device. Some non-limiting examples of non-transitory computer-readable media include CDs, DVDs, BLU-RAY, flash memory, and hard disk drives. The term "comprising" means "including, but not necessarily limited to"; it in detail indicates open-ended inclusion or membership in a so-described combination, group, series, and the like.

FIG. 1 illustrates a schematic view of at least one embodiment of a system (system 1) for detecting time difference. The system 1 at least includes a transmitting device 10, a receiving device 20, an oscilloscope 30, a display 40, and an image capturing device 50, all electrically connected.

In the system 1, the transmitting device 10 is configured to transmit signals to the receiving device 20. The receiving device 20 is configured to receive the signals from the transmitting device 10. In at least one embodiment, the transmitting device 10 and the receiving device 20 may be, but are not limited to, computers, tablet computers, notebook computers, mobile phones, personal digital assistants (PDA).

The display 40 is configured to display the signals transmitted by the transmitting device 10. In at least one embodiment, the display 40 may be, but is not limited to, an external display independent from the transmitting device 10, or a display of the transmitting device 10.

The image capturing device 50 is configured to receive and process the signals displayed in the display 40 and forward these to the receiving device 20. In at least one embodiment, the image capturing device 50 may be, but is not limited to, an IP network camera (IPCAM), which may exchange signals with the receiving device 20 wirelessly or by wires.

Figure 2:
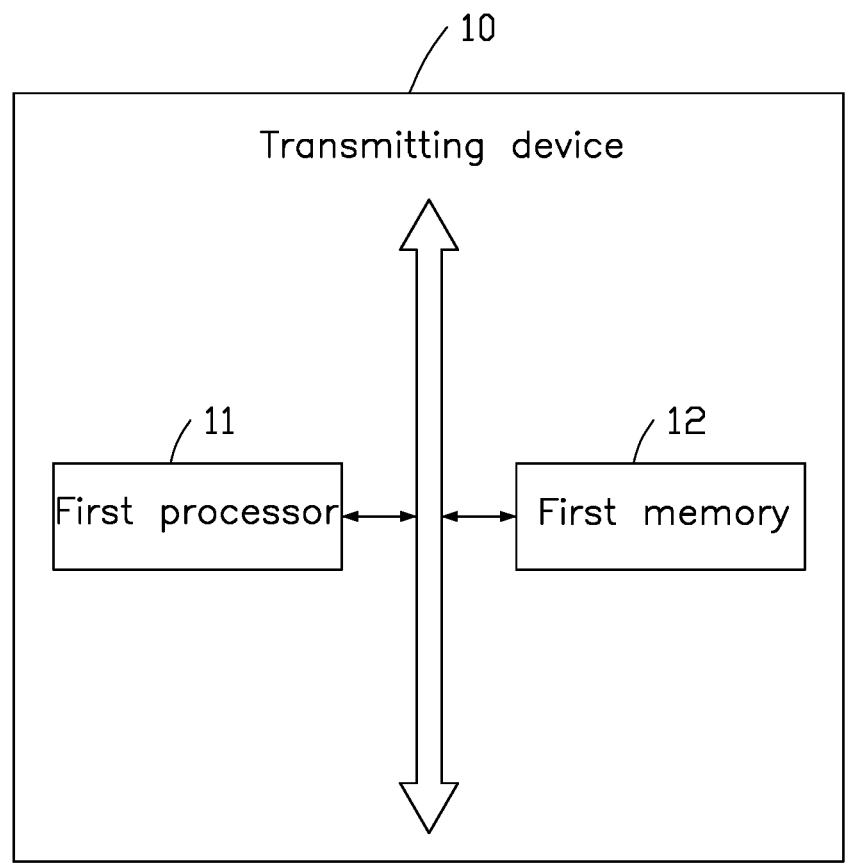
FIG. 2 is a schematic view of at least one embodiment of a transmitting device.

FIG. 2 illustrates a schematic view of at least one embodiment of the transmitting device 10. The transmitting device 10 at least include a first processor 11 and a first memory 12.

Figure 3:
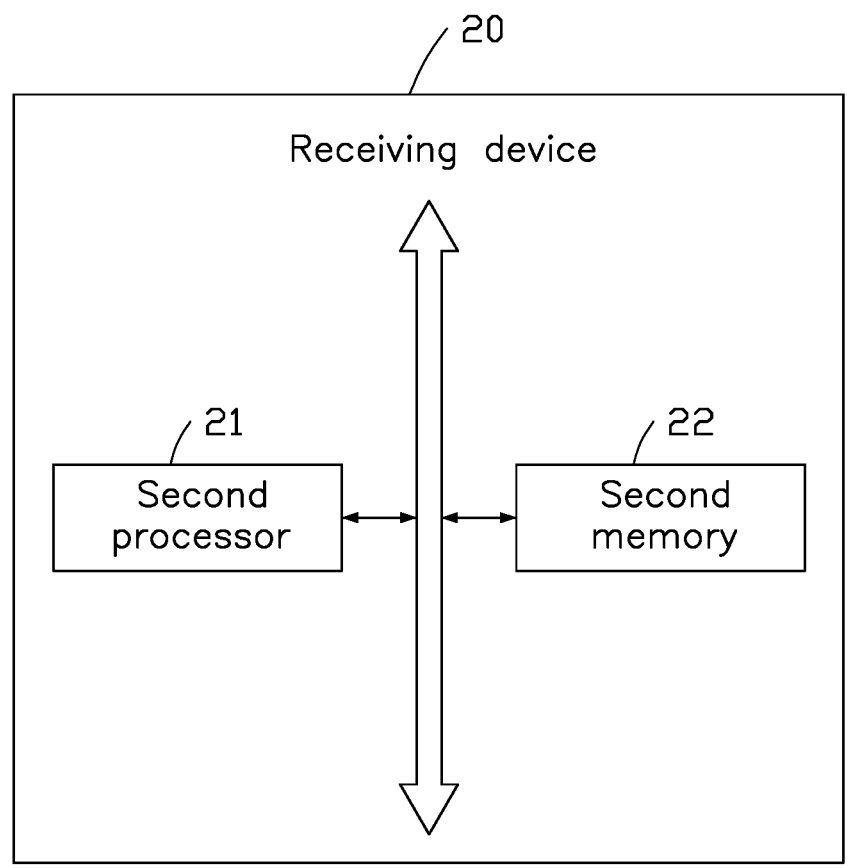
FIG. 3 is a schematic view of at least one embodiment of a receiving device.

FIG. 3 illustrates a schematic view of at least one embodiment of the receiving device 20. The receiving device 20 at least include a second processor 21 and a second memory 22.

The transmitting device 10 and the receiving device 20 may each include more or less hardware and/or software, or have different arrangements than as shown in FIGS. 2 and 3.

In at least one embodiment, the first processor 11 and the second processor 21 can be formed by integrated circuits, such as an individual integrated circuit or multiple integrated circuits with a same function or different functions. Each of the first processor 11 and the second processor 21 includes, but is not limited to, a central processing unit (CPU), a microprocessor, a digital signal processor (DSP), a graphics processor, an application specific integrated circuit (ASIC), a field-programmable gate array (FPGA), a data processor chip, a programable logic device (PLD), a discrete gate/transistor logic device, or a discrete hardware component. Each of the first processor 11 and the second processor 21 may be a control unit and electrically connected to other elements of the server system 1 through interfaces or a bus. In at least one embodiment, the various types of non-transitory computer-readable storage mediums stored in the first memory 12 can be processed by the first processor 11 to perform various functions, such as the first processor 11 processing a first system time T1 as a first image. The various types of non-transitory computer-readable storage mediums stored in the second memory 22 can be processed by the second processor 21 to perform various functions, such as the second processor 21 processing a first signal as the first image.

In at least one embodiment, the first memory 12 and the second memory 22 can include various types of non-transitory computer-readable storage mediums. The first memory 12 and the second memory 22 can rapidly and automatically access instructions and data when the system 1 is running. Each of the first memory 12 and the second memory 22 can be an internal storage system, such as a flash memory, a Random Access Memory (RAM) for the temporary storage of information, and/or a Read-Only Memory (ROM), a Programmable Read-Only Memory (PROM), Erasable Programmable Read-Only Memory (EPROM), a One-time Programmable Read-Only Memory (OTPROM), Electrically-Erasable Programmable Read-Only Memory (EEPROM), and a Compact Disc Read-Only Memory (CD-ROM) for the permanent storage of information. Each of the first memory 12 and the second memory 22 can also be an external storage system, such as a hard disk, a storage card, or a data storage medium.

A non-transitory computer-readable storage medium including program instructions for causing the computer apparatus (such as personal computer, device, or network device, etc.) or the processor to perform the method for detecting time difference is also disclosed.

In at least one embodiment, the various types of non-transitory computer-readable storage mediums stored in the first memory 12 and the second memory 22 can be processed by the first processor 11 and second processor 21 to perform various functions, such as the method for detecting time difference.

Figure 4:
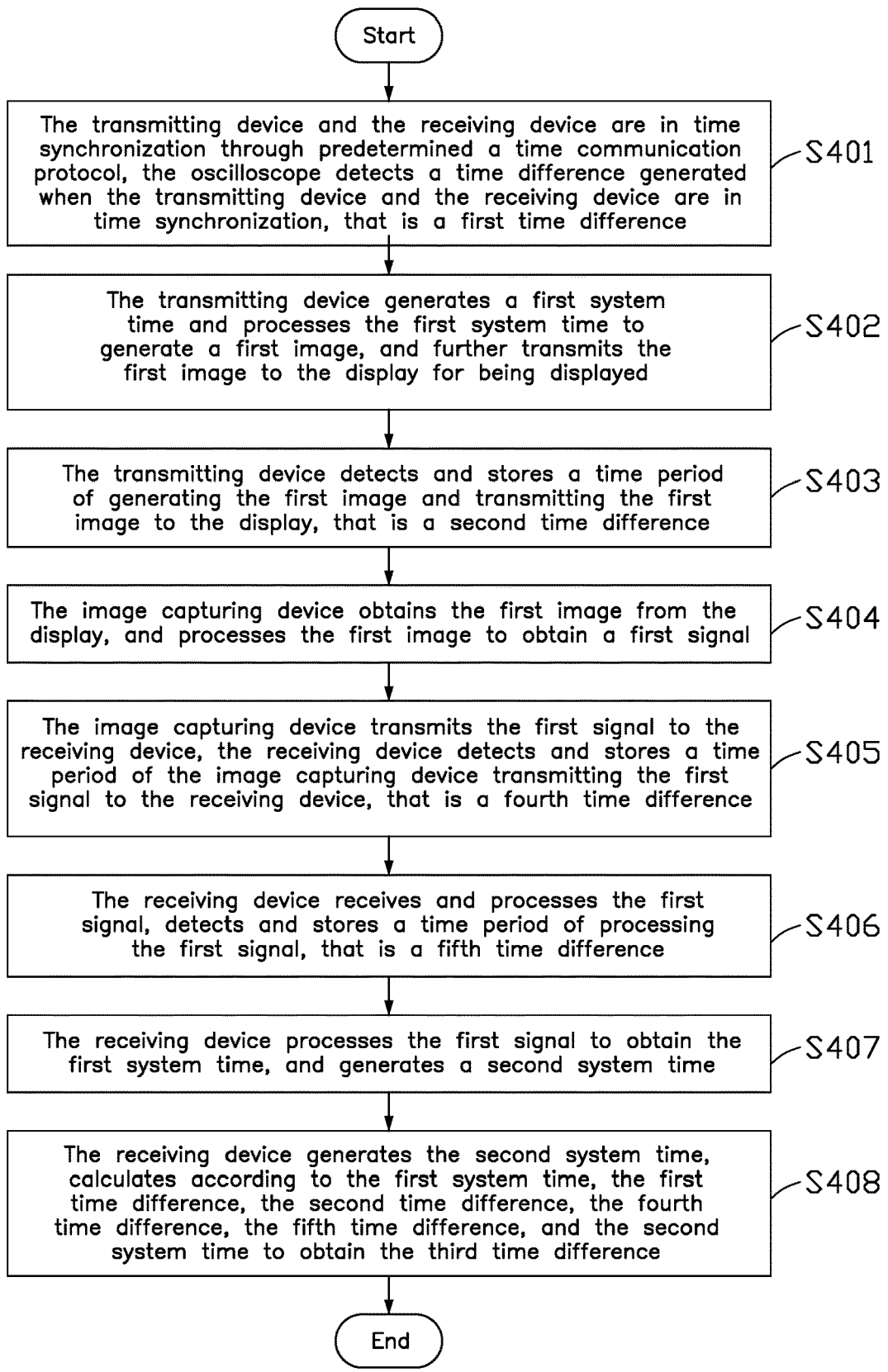
FIG. 4 illustrates a flowchart of at least one embodiment of a method for detecting

FIG. 4 illustrates a flowchart of at least one embodiment of a method for detecting time difference. The method for detecting time difference is applied in the system 1 as shown in FIG. 1, the transmitting device 10 as shown in FIG. 2, and the receiving device 20 as shown in FIG. 3. The functions may be integrated in the system 1 for the method for detecting time difference. In another embodiment, the method for detecting time difference can be run in a form of software development kit in the computer apparatus.

The method is provided by way of example, as there are a variety of ways to carry out the method. Each block shown in FIG. 4 represents one or more processes, methods, or subroutines carried out in the example method. Furthermore, the illustrated order of blocks is by example only and the order of the blocks can be changed. Additional blocks may be added or fewer blocks may be utilized, without departing from this disclosure. The example method can begin at block S401.

At block S401, the transmitting device 10 and the receiving device 20 are in time synchronization through a predetermined communication protocol, which may be a time synchronization protocol (such as IEEE1588 protocol). The oscilloscope 30 detects any time difference generated when the transmitting device 10 and the receiving device 20 are in time synchronization, which may be a first time difference t1.

In at least one embodiment, the IEEE1588 protocol may be used for the time synchronization during the method for detecting time difference. The IEEE1588 protocol may be a precise time protocol (PTP), which may reach a time synchronization precision at submicrosecond levels.

In at least one embodiment, when the transmitting device 10 and the receiving device 20 are in time synchronization through the IEEE1588 protocol, a very small time difference may be generated, which is the first time difference t1.

In at least one embodiment, the oscilloscope 30 receives voltages transmitted by the transmitting device 10 and the receiving device 20 and generates oscillograms accordingly, a time difference generated between the oscillograms may be the first time difference t1.

At block S402, after time synchronization of the transmitting device 10 and the receiving device 20, the transmitting device 10 generates a first system time T1 and processes the first system time T1 to generate a first image, and further transmits the first image to the display 40 for being displayed.

After the time synchronization of the transmitting device 10 and the receiving device 20 through the IEEE1588 protocol, the first processor 11 controls the transmitting device 10 to generate the first system time T1.

In at least one embodiment, the first system time T1 may be a start time of the transmitting device 10 transmitting signals to the receiving device 20 after the time synchronization of the transmitting device 10 and the receiving device 20, and the first system time T1 may be included in the signal that the transmitting device 10 transmits to the receiving device 20.

After the transmitting device 10 generates the first system time T1, the first processor 11 processes the first system time T1 to obtain the first image. The first processor 11 controls the transmitting device 10 to transmit the first image to the display 40 for being displayed.

In at least one embodiment, the first image may be an image or a picture, such as a Quick Response Code (QR code). The first image may be obtained by a capturing device or a scanning device (such as a camera), and may be processed to obtain content included in the first image such as the first system time T1.

At block S403, the transmitting device 10 detects and stores a time period of generating the first image and transmitting the first image to the display 40, this is a second time difference t2.

In at least one embodiment, the first processor 11, according to a first algorithm stored in the first memory 12, detects the time period of generating the first image and transmitting the first image to the display 40, that is the second time difference t2, and stores the second time difference t2 to the first memory 12.

At block S404, the image capturing device 50 obtains the first image from the display 40, and processes the first image to obtain a first signal.

The image capturing device 50 obtains and processes the first image (for instance, when the first image is a QR code, the image capturing device 50 scans the QR code to obtain information of the QR code), to obtain the first signal. In at least one embodiment, the first signal may be information in a file, that is, the image capturing device 50 compresses the first image into file format (such as H264 file format) for transmission.

A time period for the image capturing device 50 to obtain and process the first image to obtain the first signal is a third time difference t3.

At block S405, the image capturing device 50 transmits the first signal to the receiving device 20, the receiving device 20 detects and stores a time period of the image capturing device 50 transmitting the first signal to the receiving device 20, that is a fourth time difference t4.

After the image capturing device 50 processes the first image in the first signal, the image capturing device 50 transmits the first signal to the receiving device 20 through wireless signal or by wires. In at least one embodiment, the receiving device 20 detects the time period of the image capturing device 50 transmitting the first signal to the receiving device 20, that is the fourth time difference t4, and further stores the fourth time difference t4 to the second memory 22.

At block S406, the receiving device 20 receives and processes the first signal, and detects and stores a time period for processing the first signal, that is a fifth time difference t5.

After the receiving device 20 receives the first signal, the second processor 21 processes the first signal and restores the first signal as the first image, and processes the first image to obtain the first system time T1.

In at least one embodiment, the second processor 21, according to a second algorithm stored in the second memory 22, detects the time period for processing the first signal, that is the fifth time difference t5, and stores the fifth time difference t5 to the second memory 22.

At block S407, the receiving device 20 processes the first signal to obtain the first system time T1, and generates a second system time T2.

In at least one embodiment, when the receiving device 20 obtains the first system time T1 transmitted by the transmitting device 10, the receiving device 20 records and stores the time of receiving the first system time T1, that is the second system time T2.

At block S408, the receiving device 20 generates the second system time T2, makes calculations on the first system time T1, the first time difference t1, the second time difference t2, the fourth time difference t4, the fifth time difference t5, and the second system time T2 to obtain the third time difference t3, that is the time period of the image capturing device 50 obtaining and processing the first image to obtain the first signal.

In at least one embodiment, the receiving device 20 receives the first time difference t1 obtained by the oscilloscope 30 through wireless signals or wired signals, and the second time difference t2 stored in the transmitting device 10. The receiving device 20 generates the second system time T2 when completing the processing of the first signal. The second processor 21, according to a third algorithm stored in the second memory 22, calculates the first system time T1, the first time difference t1, the second time difference t2, the fourth time difference t4, the fifth time difference t5, and the second system time T2, to obtain the third time difference t3.

A formula for resolving the first system time T1, the first time difference t1, the second time difference t2, the third time difference t3, the fourth time difference t4, the fifth time difference t5, and the second system time T2 may be:

$$T2-(t2+t3+t4+t5)-t1=T1$$

The second processor 21 deducts the time of the transmitting device 10 and the receiving device 20 detecting and storing from the second system time T2, that is, the second time difference t2, the fourth time difference t4, and the fifth time difference t5 are deducted from the second system time T2, and the time difference generated during the time synchronization of the transmitting device 10 and the receiving device 20, that is the first time difference t1, is added, so as to obtain the third time difference t3. A formula for calculating the third time difference t3 may be:

$$t3=T2-T1-t2-t4-t5+t1$$

In at least one embodiment, the abovesaid blocks may be circularly executed, and the comparing and calculating of the results of each testing, such as comparing a maximum value and a minimum value and calculating an average value, may be run repeatedly so as to improve a precision of the detecting results.

The method, the system, and the non-transitory computer readable medium detects time differences from a point of synchronization between the devices using the time synchronization protocol, which may reduce a detecting error. The method further incorporates signals of transmission times in image content, and automatically detects the time periods of processing and transmitting the signals in each step of the whole procedure using predetermined algorithm, so as to record the transmitting time, the receiving time, and time periods of each step of the whole procedure, and automatically calculates the time difference of the image capturing device when it actually operates, which may improve a detecting efficiency and reduce human cost. The method for detecting time difference may be repeated many times conveniently and rapidly, which also provides more precise detecting results.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being embodiments of the present disclosure.

What is claimed is:

1. A method for detecting time difference applied in a system comprising a transmitting device, a receiving device, an oscilloscope, a display, and an image capturing device, the method comprising:

the transmitting device and the receiving device being in time synchronization, the oscilloscope detecting a time difference generated when the transmitting device and the receiving device are in time synchronization to obtain a first time difference;

the transmitting device generating a first system time after the transmitting device and the receiving device finishing the time synchronization;

the transmitting device, based on the first system time, generating a first image, and transmitting the first image to the display to generate a second time difference;

the image capturing device obtaining the first image from the display and generating a first signal according to the first image, to generate a third time difference;

the image capturing device transmitting the first signal to the receiving device, the receiving device receiving the first signal to generate a fourth time difference; and the receiving device obtaining the first system time according to the first signal and generating a second system time when obtaining the first system time, and to generate a fifth time difference.

2. The method according to claim 1, further comprising:

the transmitting device processing the first system time to generate the first image;

the transmitting device transmitting the first image to the display for being displayed; and the transmitting device detecting and storing a time period of generating the first image and transmitting the first image to the display, to obtaining the second time difference.

3. The method according to claim 2, further comprising:

the image capturing device obtaining the first image from the display and processing the first image to generate the first signal, a time period thereof is the third time difference.

4. The method according to claim 3, further comprising:

the image capturing device transmitting the first signal to the receiving device; and the receiving device detecting and storing a time period of the image capturing device transmitting the first signal to the receiving device, to obtain the fourth time difference.

5. The method according to claim 4, further comprising:

the receiving device recovering the first signal to the first image after receiving the first signal, processing the first image to obtain the first system time; and the receiving device detecting and storing a time period of processing the first signal to obtain the fifth time difference.

6. The method according to claim 1, wherein the first system time is a start time that the transmitting device transmitting signals to the receiving device after the time synchronization of the transmitting device and the receiving device, and the first system time is included in the signal that the transmitting device transmits to the receiving device.

7. The method according to claim 1, wherein the second system time is a time that the receiving device obtains the first system time.

8. The method according to claim 6, further comprising:

the receiving device receiving the first time difference obtained by the oscilloscope and the second time difference stored in the transmitting device; and when the receiving device generating the second system time, the receiving device deducting the second time difference, the fourth time difference, and the fifth time difference from the second system time, and adding the first time difference, to obtain the third time difference.

9. A system for detecting time difference comprising:

a transmitting device and a receiving device being in time synchronization;

an oscilloscope detecting a time difference generated when the transmitting device and the receiving device are in time synchronization to obtain a first time difference;

the transmitting device generating a first system time after the transmitting device and the receiving device finishing the time synchronization;

the transmitting device, based on the first system time, generating a first image, and transmitting the first image to a display to generate a second time difference;

an image capturing device obtaining the first image from the display and generating a first signal according to the first image, to generate a third time difference;

the image capturing device transmitting the first signal to the receiving device, the receiving device receiving the first signal to generate a fourth time difference; and the receiving device obtaining the first system time according to the first signal and generating a second system time when obtaining the first system time, and to generate a fifth time difference.

10. The system according to claim 9, further comprising:

the transmitting device processing the first system time to generate the first image;

the transmitting device transmitting the first image to the display for being displayed; and the transmitting device detecting and storing a time period of generating the first image and transmitting the first image to the display, to obtaining the second time difference.

11. The system according to claim 10, further comprising:

the image capturing device obtaining the first image from the display and processing the first image to generate the first signal, a time period thereof is the third time difference.

12. The system according to claim 11, further comprising:

the image capturing device transmitting the first signal to the receiving device; and the receiving device detecting and storing a time period of the image capturing device transmitting the first signal to the receiving device, to obtain the fourth time difference.

13. The system according to claim 12, further comprising:

the receiving device recovering the first signal to the first image after receiving the first signal, processing the first image to obtain the first system time; and the receiving device detecting and storing a time period of processing the first signal to obtain the fifth time difference.

14. The system according to claim 9, wherein the first system time is a start time that the transmitting device transmitting signals to the receiving device after the time synchronization of the transmitting device and the receiving device, and the first system time is included in the signal that the transmitting device transmits to the receiving device.

15. The system according to claim 9, wherein the second system time is a time that the receiving device obtains the first system time.

16. The system according to claim 14, further comprising:

the receiving device receiving the first time difference obtained by the oscilloscope and the second time difference stored in the transmitting device; and when the receiving device generating the second system time, the receiving device deducting the second time difference, the fourth time difference, and the fifth time difference from the second system time, and adding the first time difference, to obtain the third time difference.

17. A non-transitory computer readable medium comprising program instructions for causing a system, comprising a transmitting device, a receiving device, an oscilloscope, a display, and an image capturing device, to perform at least the follow:

the transmitting device and the receiving device being in time synchronization, the oscilloscope detecting a time difference generated when the transmitting device and the receiving device are in time synchronization to obtain a first time difference;

the transmitting device generating a first system time after the transmitting device and the receiving device finishing the time synchronization;

the transmitting device, based on the first system time, generating a first image, and transmitting the first image to the display to generate a second time difference;

the image capturing device obtaining the first image from the display and generating a first signal according to the first image, to generate a third time difference;

the image capturing device transmitting the first signal to the receiving device, the receiving device receiving the first signal to generate a fourth time difference; and the receiving device obtaining the first system time according to the first signal and generating a second system time when obtaining the first system time, and to generate a fifth time difference.

\* \* \* \* \*